US011036977B2

(12) United States Patent
Wang et al.

(10) Patent No.: US 11,036,977 B2
(45) Date of Patent: Jun. 15, 2021

(54) IDENTITY RECOGNITION DISPLAY DEVICE, AND ARRAY SUBSTRATE AND IDENTITY RECOGNITION CIRCUIT THEREOF

(71) Applicant: BOE TECHNOLOGY GROUP CO., LTD., Beijing (CN)

(72) Inventors: Pengpeng Wang, Beijing (CN); Xue Dong, Beijing (CN); Jing Lv, Beijing (CN); Haisheng Wang, Beijing (CN); Chunwei Wu, Beijing (CN); Xiaoliang Ding, Beijing (CN); Yingming Liu, Beijing (CN); Wei Liu, Beijing (CN); Yanling Han, Beijing (CN); Xueyou Cao, Beijing (CN); Ping Zhang, Beijing (CN); Changfeng Li, Beijing (CN); Lijun Zhao, Beijing (CN); Rui Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 573 days.

(21) Appl. No.: 15/573,228

(22) PCT Filed: Jun. 8, 2017

(86) PCT No.: PCT/CN2017/087561
§ 371 (c)(1),
(2) Date: Nov. 10, 2017

(87) PCT Pub. No.: WO2018/032864
PCT Pub. Date: Feb. 22, 2018

(65) Prior Publication Data
US 2018/0357464 A1    Dec. 13, 2018

(30) Foreign Application Priority Data
Aug. 15, 2016 (CN) .......................... 201610671900.8

(51) Int. Cl.
*G06K 9/00* (2006.01)
*H01L 27/32* (2006.01)
(Continued)

(52) U.S. Cl.
CPC ......... *G06K 9/0051* (2013.01); *G06K 9/0004* (2013.01); *G06K 9/209* (2013.01);
(Continued)

(58) Field of Classification Search
CPC .... G06K 9/0004; G06K 9/0051; G06K 9/209; G09G 2310/08; G09G 3/3208;
(Continued)

(56) References Cited

U.S. PATENT DOCUMENTS

| 2006/0256093 | A1  | 11/2006 | Furukawa et al. |
| 2008/0129898 | A1* | 6/2008  | Moon .................. G06F 3/0418 349/12 |

(Continued)

FOREIGN PATENT DOCUMENTS

| CN | 101079102 A | 11/2007 |
| CN | 101178524 A | 5/2008  |

(Continued)

OTHER PUBLICATIONS

First Office Action for Chinese Patent Application No. 201610671900.8 dated Feb. 27, 2018.
(Continued)

*Primary Examiner* — Michael J Vanchy, Jr.
(74) *Attorney, Agent, or Firm* — Calfee, Halter & Griswold LLP

(57) ABSTRACT

An identity recognition device, and an substrate and an identity recognition circuit are disclosed. In the substrate, a plurality of second recognition output lines are added to be arranged in pairs with first recognition output lines. A control signal loaded to the control signal line will be
(Continued)

coupled to the first and second recognition output lines by the parasitic capacitance between the control signal line and the recognition output lines to cause similar signal interference to the first and second recognition output lines. During the identity recognition time period, the signal interference in the electric signal outputted by the first recognition output line can be removed by utilizing the similar noise signal received by the second recognition output line, in such a way to improve the signal-to-noise ratio and detection precision of the identity recognition signal.

20 Claims, 6 Drawing Sheets

(51) Int. Cl.
*G06K 9/20* (2006.01)
*G09G 3/3208* (2016.01)
*H01L 27/146* (2006.01)

(52) U.S. Cl.
CPC ....... *G09G 3/3208* (2013.01); *H01L 27/3234* (2013.01); *G09G 2310/08* (2013.01); *H01L 27/14678* (2013.01)

(58) Field of Classification Search
CPC ........... H01L 27/14678; H01L 27/3234; H01L 27/14603; H01L 27/14612; H01L 27/14634; H01L 27/14636; H01L 27/14643; H01L 27/1469; G02F 1/13338; G06F 3/0412; G06F 3/0418; G06F 3/047; H04N 5/3741
See application file for complete search history.

(56) References Cited

U.S. PATENT DOCUMENTS

| 2010/0079401 | A1 | 4/2010 | Staton |
| 2013/0181949 | A1 | 7/2013 | Setlak |
| 2015/0071502 | A1 | 3/2015 | Breznicky |
| 2017/0125464 | A1* | 5/2017 | Abe ................. H01L 27/14612 |
| 2017/0147860 | A1 | 5/2017 | Yang et al. |
| 2017/0221972 | A1 | 8/2017 | Yang et al. |
| 2017/0255810 | A1 | 9/2017 | Liu et al. |
| 2018/0032780 | A1 | 2/2018 | Li et al. |

FOREIGN PATENT DOCUMENTS

| CN | 101329727 A | 12/2008 |
| CN | 101350066 A | 1/2009 |
| CN | 102239461 A | 11/2011 |
| CN | 104182745 A | 12/2014 |
| CN | 104537371 A | 4/2015 |
| CN | 105047689 A | 11/2015 |
| CN | 105373772 A | 3/2016 |
| CN | 105447438 A | 3/2016 |
| CN | 106157891 A | 11/2016 |
| CN | 205900068 U | 1/2017 |
| TW | 201337783 A | 9/2013 |

OTHER PUBLICATIONS

Search Report for International Application No. PCT/CN2017/087561 dated Aug. 30, 2017.

* cited by examiner

IDENTITY RECOGNITION DISPLAY DEVICE, AND ARRAY SUBSTRATE AND IDENTITY RECOGNITION CIRCUIT THEREOF

RELATED APPLICATIONS

The present application is the U.S. national phase entry of PCT/CN2017/087561 with an International filing date of Jun. 8, 2017, which claims the benefit of Chinese Patent Application No. 201610671900.8, filed on Aug. 15, 2016, the entire disclosure of which is incorporated herein by reference.

TECHNICAL FIELD

The present invention relates to the field of display technology, and more particular to an identity recognition device as well as a substrate and an identity recognition circuit comprised therein.

BACKGROUND ART

With the rapid development of display technology, a display panel having an identity recognition function has gradually become popular in people's lives. At present, an identity recognition display device can realize an optical texture or print recognition function by utilizing, e.g., the photosensitive property of a PIN junction, and in order not to affect the normal display effect of a pixel 1, i.e., the aperture ratio of the pixel 1, as shown in FIG. 1, a photosensitive element 2 is usually disposed in a position corresponding to the gap between the pixels 1, i.e., the photosensitive element 2 is disposed in a position corresponding to a non-display area. The photosensitive element 2 will receive a light reflected by the structure of a finger, comprising textures or prints, to produce a photocurrent. Since the intensity of light reflected by valleys and ridges varies, the resulting photocurrent varies too, thereby realizing the function of recognizing the valleys and ridges of a structure comprising textures or prints.

To be specific, the photosensitive element 2 comprises: by taking a finger for example, a photosensitive diode 21 for sensing a light intensity variation caused by pressing of a structure comprising textures or prints, and a control transistor 22 for controlling the photosensitive diode 21 to convert the light intensity variation into different electric signal outputs, wherein the drain of the control transistor 22 is connected with one electrode terminal of the photosensitive diode 22, the source thereof is connected with a recognition output line 3, and the gate thereof is connected with a scanning signal line 4. Due to the differences between valleys and ridges of a fingerprint, a light source irradiated onto a finger will result in different reflection, the photosensitive diode 21 receives different light intensities and produces different photocurrents, the control transistor 22 is turned on by the scanning signal line 4, the recognition output line 3 sequentially reads out the different currents of the photosensitive diodes 21 and outputs them to a detection circuit 5 to realize the detection of the valleys and ridges of the fingerprint. Since the photosensitive diode 21 needs to work in a reverse-bias state, the other electrode terminal of the photosensitive diode 21 is usually connected with a constant potential Vd.

While the photosensitive diode 21 receives the light reflected back by the fingerprint to produce a photocurrent, a display light in the identity recognition display device will also be irradiated onto the photosensitive diode 21 via a different route to thereby form a noise, which may finally render an identity recognition signal undistinguishable. Due to this, an amplitude modulation technology is currently used during the identity recognition time period to enable the identity recognition display device to emit a modulated light, which is irradiated onto a finger and then reflected to the photosensitive diode 21. As shown in FIG. 2, during the identity recognition time period, a modulator produces a constant-frequency square wave signal that is divided into two parts: one is used for driving the pixel to emit a light and produce a modulated optical signal, and the other is used for demodulating the identity recognition signal. When a finger is pressed onto the identity recognition display device, the modulated optical signal is irradiated onto the finger for reflection, the reflected, modulated light is irradiated onto the photosensitive diode 21 to produce a photocurrent, and the photocurrent first enters into a voltage conversion circuit to convert a photocurrent signal into a photovoltage signal, and then enters via a first filter-amplifying circuit into a demodulation circuit for demodulation. Another signal outputted from the modulator needs to be used for demodulating the identity recognition signal. After being demodulated by the demodulation circuit, the signal is finally low-pass filtered by a second filter circuit having a low-pass filter to obtain an extracted fingerprint signal, which is converted from an analog signal to a digital signal in an analog-to-digital conversion circuit and eventually outputted to a CPU for subsequent processing to obtain a fingerprint image. Utilization of the modulated light can resist against the interference by ambient light, ambient noise and electric noise, and increase a signal-to-noise ratio.

SUMMARY

However, in the photosensitive element 2 in the prior art, when the modulated light is used to demodulate the identity recognition signal, noise at the same frequency and the same phase cannot be removed. Thus, the technical problem to be urgently addressed by those skilled in the art is how to effectively remove the noise interference from the recognition output line and improve the signal-to-noise ratio of the identity recognition signal, thereby ensuring a detection precision of identity identification.

To address or alleviate at least one defect in the prior art, there is provided an identity recognition substrate according to one aspect. The identity recognition substrate comprises: a plurality of pixel circuits arranged in array on a base substrate, a plurality of control signal lines connected correspondingly with respective rows of the pixel circuits, a plurality of photosensitive elements arranged in array, a plurality of first recognition output lines connected correspondingly with respective columns of the photosensitive elements, a plurality of second recognition output lines arranged in pairs with the first recognition output lines, and a detection circuit connected with the first recognition output lines and the second recognition output lines respectively. A first recognition output line and a second recognition output line arranged in pair extend in the same direction; the second recognition output line is only connected with the detection circuit; the detection circuit is configured to denoise an electric signal outputted from the first recognition output line according to a noise signal outputted from the second recognition output line during the identity recognition time period.

In a possible implementation, in the identity recognition substrate, the first recognition output line and the second recognition output line arranged in pair can be located in the same gap between the pixel circuits.

In a possible implementation, in the identity recognition substrate, the first recognition output line and the second recognition output line arranged in pair can be arranged substantially mutually in parallel.

In a possible implementation, in the identity recognition substrate, the second recognition output line and the first recognition output line can be arranged in the same layer, and the second recognition output line and the first recognition output line can have an equal line width.

In a possible implementation, in the identity recognition substrate, the second recognition output line can be connected at only one end with the detection circuit and arranged in suspension at the other end.

In a possible implementation, in the identity recognition substrate, the detection circuit can comprise a plurality of detection sub-circuits. Each of the detection sub-circuits corresponds in a one-to-one relationship to and is connected with each pair of the first recognition output line and second recognition output line.

In a possible implementation, each of the detection sub-circuits comprises: a differential circuit configured to differentiate electric signals outputted from the first recognition output line and the second recognition output line to obtain a differential signal, thereby denoise an electric signal outputted from the first recognition output line.

In a possible implementation, in the identity recognition substrate, each of the detection sub-circuits comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the differential circuit and configured to filter-amplify the differential signal;

a demodulation circuit connected with an output terminal of the first filter-amplifying circuit and configured to demodulate the filter-amplified differential signal according to a received fingerprint demodulation carrier wave signal sent by a modulator;

a second filter-amplifying circuit connected with an output terminal of the demodulation circuit and configured to filter-amplify the demodulated differential signal; and an analog-to-digital conversion circuit connected with an output terminal of the second filter-amplifying circuit and configured to convert the filter-amplified demodulated differential signal from an analog signal into a digital signal, wherein the differential circuit is connected to the output terminal of the first voltage conversion circuit and the output terminal of the second voltage conversion circuit, and configured to differentiate the first voltage signal and the second voltage signal to obtain the differential signal.

In a possible implementation, in the identity recognition substrate, each of the detection sub-circuits specifically comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the first voltage conversion circuit and configured to filter-amplify the first voltage signal;

a second filter-amplifying circuit connected with an output terminal of the second voltage conversion circuit and configured to filter-amplify the second voltage signal;

a demodulation circuit connected with an output terminal of the differential circuit and configured to demodulate the differential signal according to a received fingerprint demodulation carrier wave signal sent by a modulator;

a third filter-amplifying circuit connected with an output terminal of the demodulation circuit and configured to filter-amplify the demodulated differential signal; and an analog-to-digital conversion circuit connected with an output terminal of the third filter-amplifying circuit and configured to convert the filter-amplified demodulated differential signal from an analog signal into a digital signal, wherein the differential circuit is connected to the output terminal of the first filter-amplifying circuit and the output terminal of the second filter-amplifying circuit, and configured to differentiate the filter-amplified first voltage signal and the filter-amplified second voltage signal to obtain the differential signal.

In a possible implementation, in the identity recognition substrate, each of the detection sub-circuits comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the first voltage conversion circuit and configured to filter-amplify the first voltage signal;

a second filter-amplifying circuit connected with an output terminal of the second voltage conversion circuit and configured to filter-amplify the second voltage signal;

a first demodulation circuit connected with an output terminal of the first filter-amplifying circuit and configured to demodulate the filter-amplified first voltage signal according to a received fingerprint demodulation carrier wave signal sent by a modulator;

a second demodulation circuit connected with an output terminal of the second filter-amplifying circuit and configured to demodulate the filter-amplified second voltage signal according to the received fingerprint demodulation carrier wave signal sent by the modulator;

a third filter-amplifying circuit connected with an output terminal of the differential circuit and configured to filter-amplify the differential signal; and an analog-to-digital conversion circuit connected with an output terminal of the third filter-amplifying circuit and configured to convert the filter-amplified differential signal from an analog signal into a digital signal, wherein the differential circuit is connected to the output terminal of the first demodulation circuit and the output terminal of the second demodulation circuit, and configured to differentiate the demodulated first voltage signal and the demodulated second voltage signal to obtain the differential signal.

In a possible implementation, in the identity recognition substrate, the fingerprint demodulation carrier wave signal can have the same signal frequency as the control signal.

In a possible implementation, in the identity recognition substrate, a particular fixed phase difference can exist between the fingerprint demodulation carrier wave signal and the control signal.

In a possible implementation, in the identity recognition substrate, the fixed phase difference may be 0 or 180 degrees.

According to another aspect, there is provided an identity recognition device comprising any identity recognition substrate as stated above.

According to another aspect, there is provided an identity recognition circuit. The identity recognition circuit comprises: a photosensitive element, a first recognition output line connected correspondingly with the photosensitive element, a second recognition output line arranged in pair with the first recognition output line, and a detection sub-circuit connected with the first recognition output line and the second recognition output line respectively, wherein the first recognition output line and the second recognition output line arranged in pair extend in the same direction; the second recognition output line is only connected with the detection sub-circuit; the detection sub-circuit is configured to denoise an electric signal outputted from the first recognition output line according to a noise signal outputted from the second recognition output line during the identity recognition time period.

Some embodiments of the present disclosure can realize at least one of the following advantageous effects and/or other advantageous effects.

In an identity recognition substrate provided by some embodiments of the present disclosure, a plurality of second recognition output lines are added to be arranged in pairs with first recognition output lines. An orthographic projection of a control signal line connected with a pixel circuit on the base substrate overlaps with respective orthographic projections of the first recognition output line and the second recognition output line that are arranged in pair. A parasitic capacitance will unavoidably be produced in the overlapping area, the control signal loaded to the control signal line will be coupled to the first recognition output line and the second recognition output line by the parasitic capacitance to cause similar signal interference to the first recognition output line and the second recognition output line, and meanwhile the first recognition output line and the second recognition output line will also receive similar signal interference from other unknown noises. During the identity recognition time period, after denoising the electric signal outputted from the first recognition output line in the detection circuit, the signal interference in the electric signal outputted by the first recognition output line can be removed by utilizing the noise signal received by the second recognition output line, which is substantially the same as that of the first recognition output line, in such a way to improve the signal-to-noise ratio of the identity recognition signal and guarantee the detection precision of the identity recognition signal.

BRIEF DESCRIPTION OF DRAWINGS

To explain the technical solutions of some embodiments of the present disclosure more clearly, the present disclosure provides the following drawings for use when describing the embodiments. It shall be appreciated that the following drawings are only related to some embodiments. Without making inventive labor, those ordinarily skilled in the art can also obtain other drawings according to these drawings, and the other drawings are within the scope of the present invention.

DETAILED DESCRIPTION

For better understanding of the objects, technical solutions and advantages of some embodiments, the implementations of an identity recognition device and a driving method provided by these embodiments will be explained in detail with reference to the drawings and detailed description. Although the following description explains these embodiments by taking an identity recognition display device and an identity recognition display array substrate for example, it will be appreciated by those ordinarily skilled in the art that these embodiments are not limited to the identity recognition display device and identity recognition display array substrate. These embodiments can also be applicable to other kinds of identity recognition devices and identity recognition substrates.

The term "identity" used herein is used to cover all kinds of textures or prints on any people or entities that are distinguishable between different people or entities and that can be used to recognize different people or entities. Although the disclosure describes with reference to the skin texture, the present invention is not limited to the skin texture.

Figure 1:
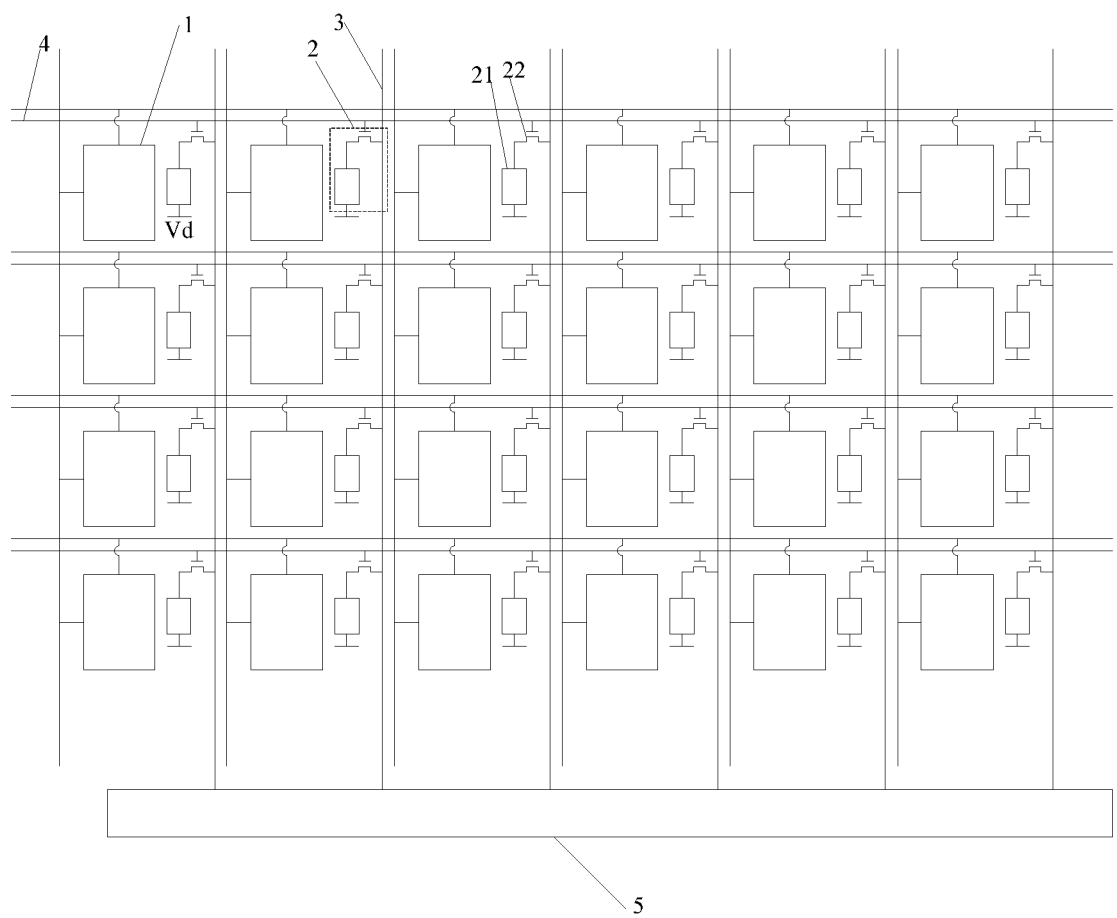
FIG. 1 is a structural schematic view of an optical identity recognition display device in the prior art.
Figure 2:
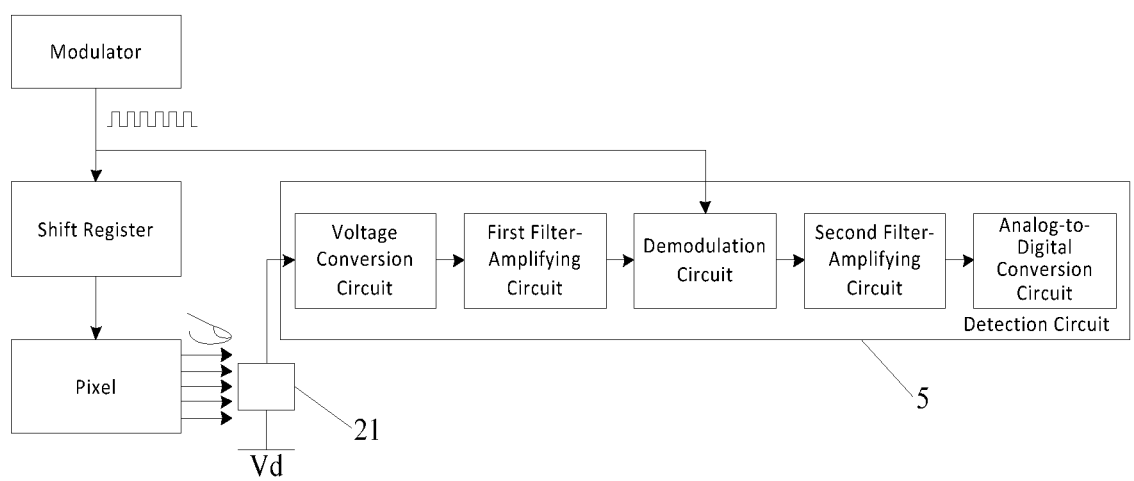
FIG. 2 is a structural schematic view of a circuit of the optical identity recognition display device in the prior art.
Figure 3:
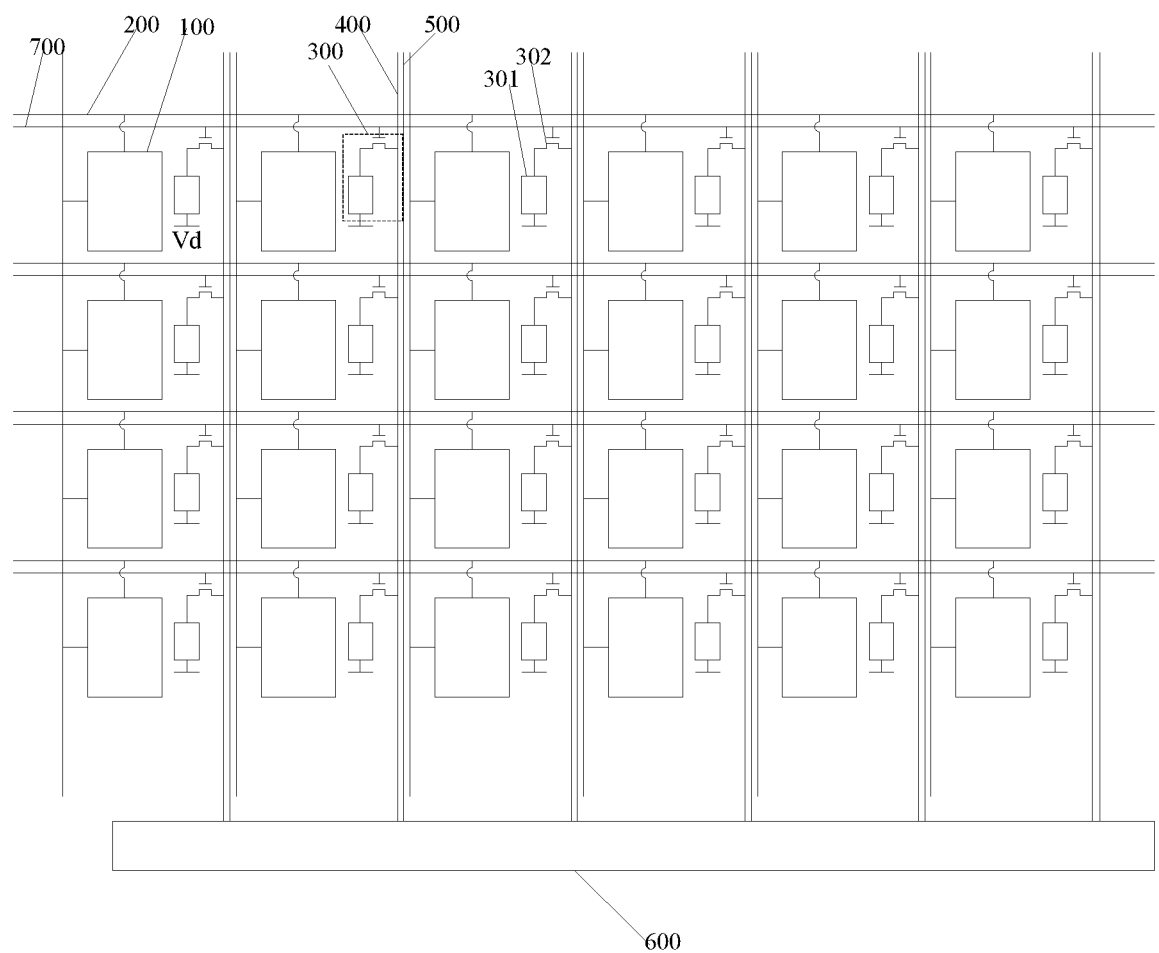
FIG. 3 is a structural schematic view of an identity recognition display device according to an embodiment.

There is provided an identity recognition display device according to an embodiment. As shown in FIG. 3, the identity recognition display device comprises an identity recognition display array substrate and a detection circuit 600. To be specific, the identity recognition display device comprises: a plurality of pixel circuits 100 arranged in array on a base substrate, a plurality of control signal lines 200 connected correspondingly with respective rows of the pixel circuits 100, a plurality of photosensitive elements 300 arranged in array, a plurality of first recognition output lines 400 connected correspondingly with respective columns of the photosensitive elements 300, a plurality of second recognition output lines 500 arranged in pairs with the first recognition output lines 400, and a detection circuit 600 connected with the first recognition output lines 400 and the second recognition output lines 500 respectively. As shown, a first recognition output line 400 and a second recognition output line 500 arranged in pair extend in the same direction. The second recognition output line 500 is only connected with the detection circuit 600. The detection circuit 600 can be configured to denoise an electric signal outputted from the first recognition output line 400 according to a noise signal outputted from the second recognition output line 500 during the identity recognition time period.

In addition, what needs to be pointed out is that the identity recognition display device may comprise a plurality of identity recognition circuits. The identity recognition circuit comprises: a photosensitive element 300, a first recognition output line 400 connected correspondingly with the photosensitive element 300, a second recognition output line 500 arranged in pairs with the first recognition output line 400, and a detection sub-circuit connected with the first recognition output line and the second recognition output line respectively. The first recognition output line 400 and the second recognition output line 500 arranged in pair extend in the same direction. The second recognition output line 500 is only connected with the detection sub-circuit. The detection sub-circuit can be configured to denoise an electric signal outputted from the first recognition output line 400 according to a noise signal outputted from the second recognition output line 500 during the identity recognition time period.

When putting the identity recognition display device into practice, no limitation is set to the type of the pixel circuit 100. An OLED pixel circuit can be used for illumination, for example, the pixel circuit shown in e.g. FIG. 4 or the liquid crystal display circuit can be used for illumination. The liquid crystal display circuit mentioned herein comprises a switch transistor and a pixel electrode, and a liquid crystal molecule and a common electrode which correspond to the pixel electrode, wherein the first control signal line is specifically a gate signal line connected with the gate of the switch transistor.

Figure 5:
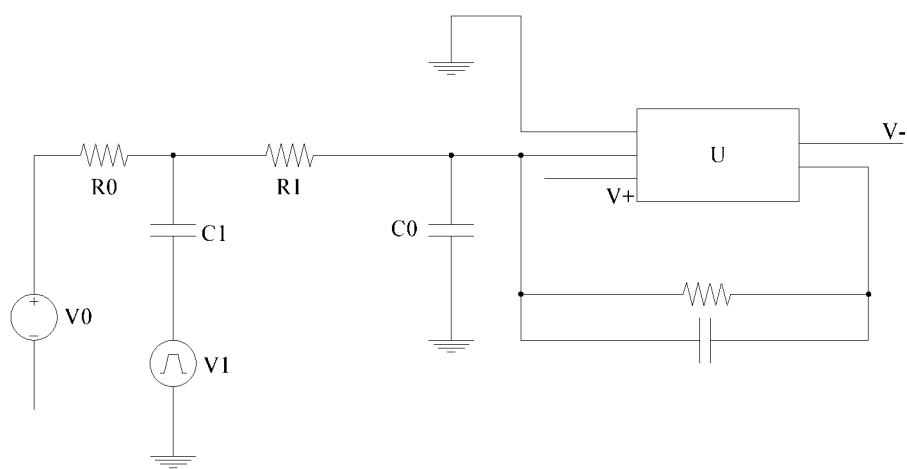
FIG. 5 is an equivalent circuit model diagram of a recognition output line in the identity recognition display device.
Figure 6:
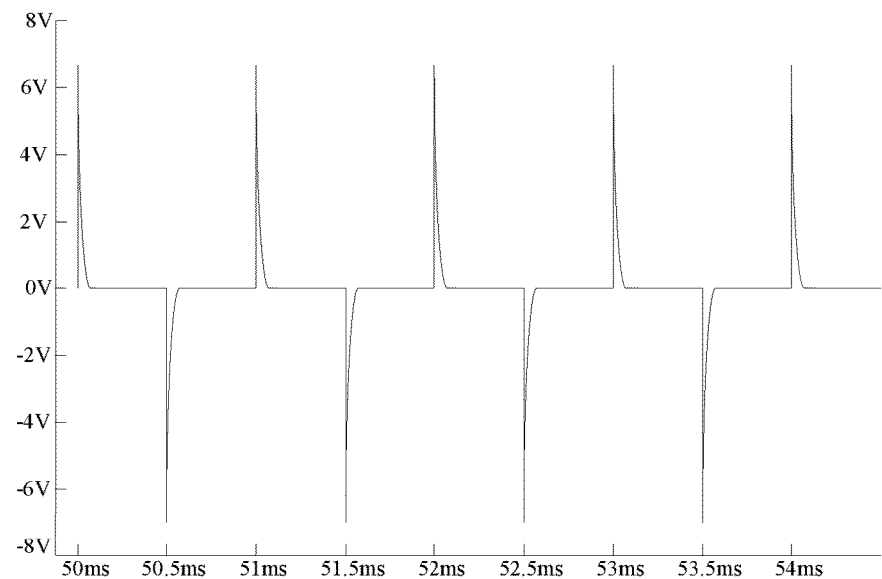
FIG. 6 is a simulation result diagram showing the relationship between the voltage of the signal outputted from the recognition output line in the identity recognition display device and time.

From an equivalent circuit module of the recognition output line in the current identity recognition display device shown in FIG. 5, it can be known that the first control signal line serving as an equivalent square wave signal source V1 is coupled to the recognition output line by an equivalent parasitic capacitance C1 in a position where the first control signal line overlaps with the recognition output line, thereby causing interference to the identity recognition signal outputted by the photosensitive diode 21 (as an equivalent signal source V0) to the recognition output line, wherein R0 is an equivalent resistance of the photosensitive diode 21 connected with the recognition output line, R1 is an equivalent resistance of the recognition output line, C0 is an equivalent earth capacitance of the recognition output line, and the rightmost capacitance and resistance connected with an operational amplifier U is the capacitance and resistance required for trans-impedance amplification. Signal simulation of the model results in the relationship between the voltage of the output signal of the recognition output line and time as shown in FIG. 6. As shown in FIG. 6, the trans-impedance amplification of the output signal of the recognition output line by the operational amplifier U will result in about 8V peak interference, which is very bad to subsequent signal amplification processing.

In the identity recognition display device according to an embodiment, a plurality of second recognition output lines 500 is added to be arranged in pairs with first recognition output lines 400, an orthographic projection of the control signal line 200 connected with the pixel circuit 100 on the base substrate overlaps with respective orthographic projections of the first recognition output line 400 and the second recognition output line 500 that are arranged in pair. A parasitic capacitance will unavoidably be produced in the overlapping area, the control signal loaded to the control signal line 200 will be coupled to the first recognition output line 400 and the second recognition output line 500 by the parasitic capacitance to cause similar signal interference to the first recognition output line 400 and the second recognition output line 500. Meanwhile the first recognition output line 400 and the second recognition output line 500 will also receive similar signal interference from other unknown noises. During the identity recognition time period, after denoising the electric signal outputted from the first recognition output line 400 in the detection circuit, the signal interference in the electric signal outputted by the first recognition output line 400 can be removed by utilizing the noise signal received by the second recognition output line 500, which is substantially the same as that of the first recognition output line 400, in such a way to improve the signal-to-noise ratio of the identity recognition signal and guarantee the detection precision of the identity recognition signal.

In an embodiment, during an implementation, in order not to affect the normal display effect of the pixel circuit 100, i.e., the aperture ratio of the pixel circuit 100, the photosensitive element 300 is usually disposed in a position corresponding to the gap between the pixel circuits 100, i.e., the photosensitive element 300 is disposed in a position corresponding to a non-display area, as shown in FIG. 3. It shall be pointed out that FIG. 3 just exemplarily illustrates the case where there are disposed photosensitive elements 300 in the positions corresponding to all of the gaps between the pixel circuits 100. During an implementation, no limitation is set to the relationship between the distribution density of the photosensitive elements 300 and the distribution density of the pixel circuits 100.

In an embodiment, as shown in FIG. 3, the photosensitive element 300 comprises: a photosensitive diode 301 for sensing a light intensity variation caused by pressing of a fingerprint, and a control transistor 302 for controlling the photosensitive diode 301 to convert the light intensity variation into different electric signal outputs, wherein the drain of the control transistor 302 can be connected with one electrode terminal of the photosensitive diode 301, the source thereof can be connected with the first recognition output line 400, and the gate thereof can be connected with a scanning signal line 700. When the scanning signal line 700 is loaded with a scanning driving signal, the control transistor 302 is in an ON state, and the first recognition output line 400 is electrically connected with the photosensitive diode 301. Due to the differences between valleys and ridges of a fingerprint or palmprint, a light source irradiated onto a finger will result in different reflection, and the photosensitive diode 301 receives different light intensities and produces different photocurrents. The control transistor 302 is turned on by the scanning signal line 700, the first recognition output line 400 sequentially reads out the different currents of the photosensitive diodes 301 and outputs them to the detection circuit 600 to realize the detection of the valleys and ridges of the textures or prints. Since the photosensitive diode 301 needs to work in a reverse-bias state, the other electrode terminal of the photosensitive diode 301 is usually connected with a constant potential Vd.

During an implementation, in order to make the noise signal received by the second recognition output line 500 and the noise signal received by the first recognition output line 400 as consistent as possible, in an embodiment, the first recognition output line 400 and the second recognition output line 500 arranged in pair can be made as close to each other as possible. Then, as shown in FIG. 3, the first recognition output line 400 and the second recognition output line 500 arranged in pair can be disposed in the same gap between the pixel circuits 100. Of course, those ordinarily skilled in the art can understand that the present disclosure is not limited to disposing the first recognition output line 400 and the second recognition output line 500 arranged in pair in the same gap between the pixel circuits 100. During an implementation, other manners can be adopted. For example, when the distribution density of the photosensitive elements 300 is less than the distribution density of the pixel circuits 100, i.e., when the photosensitive element 300 is disposed in the gap between the spaced pixel circuits 100, the first recognition output line 400 and the second recognition output line 500 arranged in pair can be disposed in the gap between two adjacent columns of pixel circuits 100 and another two adjacent columns of pixel circuits 100.

In the identity recognition display device according to an embodiment, the first recognition output line 400 and the second recognition output line 500 arranged in pair, which are disposed in the same gap between the pixel circuits, may also be arranged substantially mutually in parallel.

Figure 7:
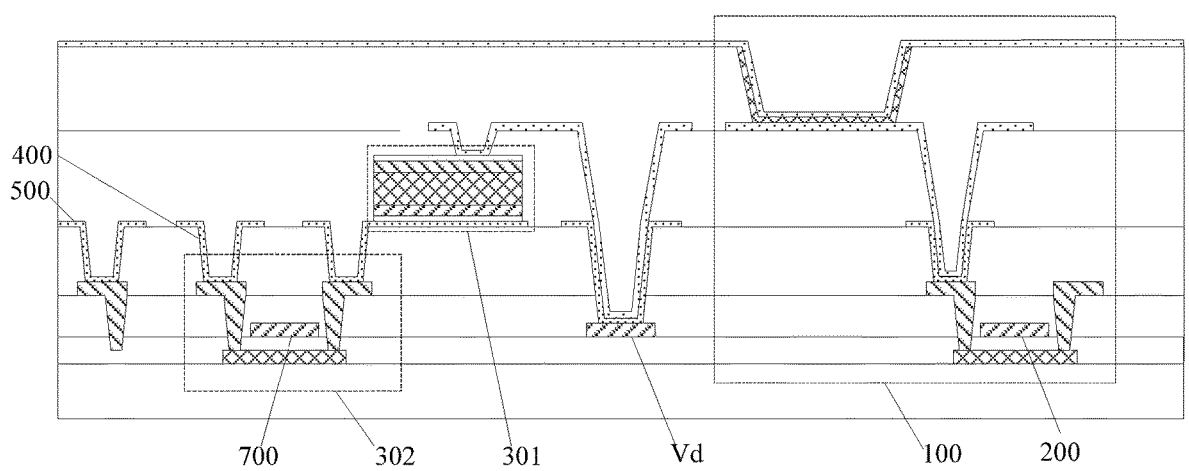
FIG. 7 is a cross-sectional schematic view of a pixel circuit in the identity recognition display device provided by an embodiment.

In an embodiment, during an implementation, in order to make the noise signal received by the second recognition output line 500 and the noise signal received by the first recognition output line 400 as consistent as possible, the first recognition output line 400 and the second recognition output line 500 may, as shown in FIG. 7, be arranged in the same layer and substantially in parallel. In an embodiment, the first recognition output line 400 and the second recognition output line 500 may have an equal line width.

In an embodiment, during an implementation, in order to make the noise signal received by the second recognition output line 500 and the noise signal received by the first recognition output line 400 as consistent as possible, the second recognition output line 500 may be arranged as shown in FIG. 3, that is, the second recognition output line 500 can be connected at one end with the detection circuit 600 and arranged in suspension at the other end.

Figure 4:
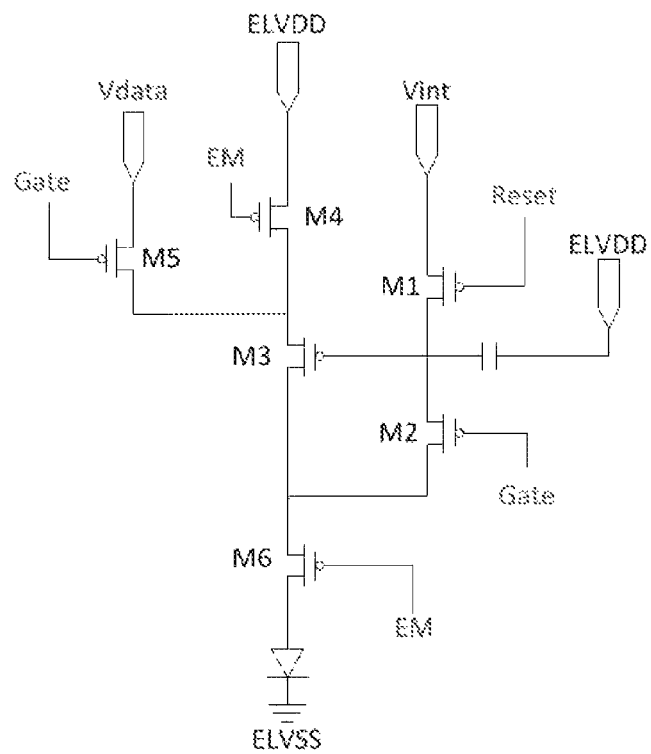
FIG. 4 is a structural schematic view of an OLED pixel circuit.

The specific structure of an integrated driver circuit will be explained by taking an OLED pixel circuit in, e.g., FIG. 4 used as the pixel circuit 100 for example. The signal timing diagram of each port corresponding to the OLED pixel circuit in FIG. 4 is shown in FIG. 8, wherein the signal loaded to a reset signal terminal Reset, a scanning signal terminal Gate and a control terminal EM is a timing signal outputted by the integrated driver circuit, the reference potential of a reference signal terminal Vint and the potential of a high-level signal terminal ELVDD and a low-level signal terminal ELVSS need to be provided by an external FPC, a data signal of a data signal terminal Vdata is provided by a source IC chip, and a fingerprint demodulation carrier wave signal is a carrier wave signal provided by a modulator to a demodulation circuit in the detection circuit.

Figure 8:
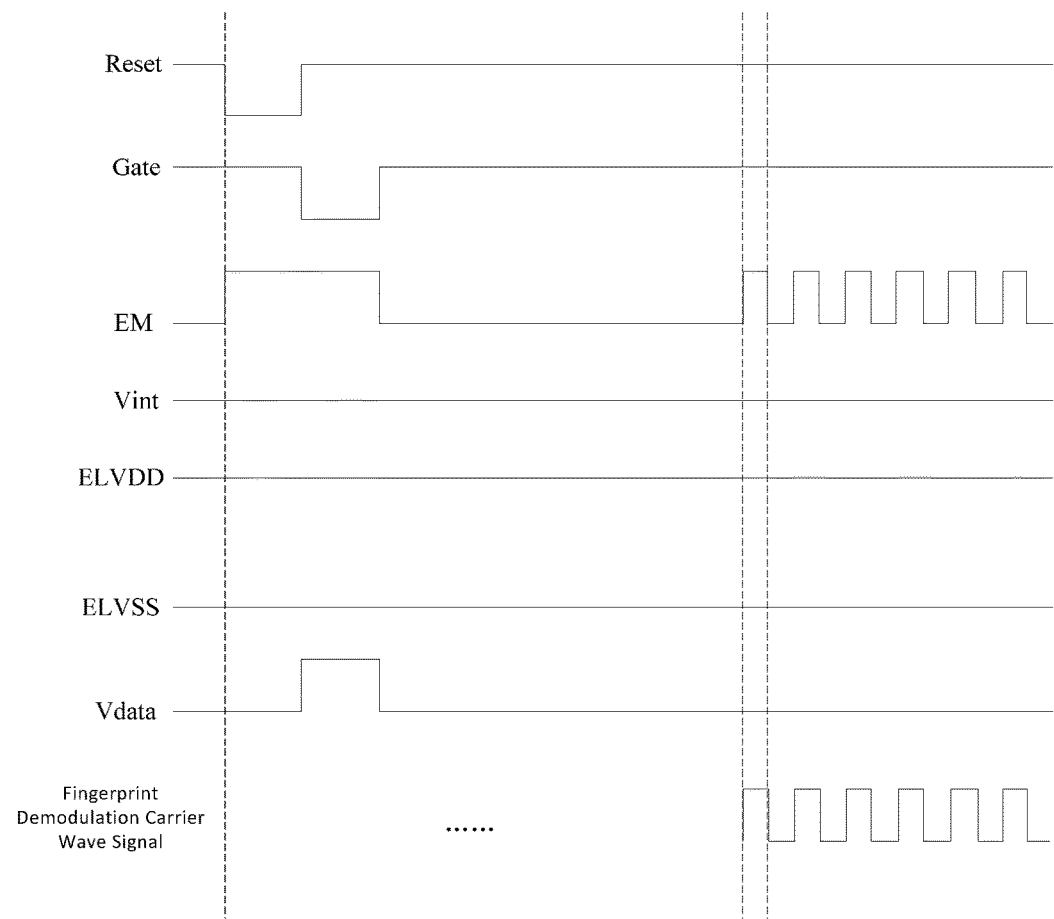
FIG. 8 is a timing diagram for signals corresponding to those of FIG. 4 in the identity recognition display device provided by an embodiment.

It can be seen from the signal timing diagram in FIG. 8 that the timing of the display device can be divided into two phases, i.e., a display time period and an identity recognition time period. In the display time period, the OLED pixel circuit normally emits a light for display. After entry into the identity recognition time period, the control terminal EM receives the square wave signal as the first control signal, and the square wave signal enables the OLED pixel circuit to emit a modulated light. The fingerprint demodulation carrier wave signal provided by the demodulation circuit has no function to the OLED pixel circuit, and can only be utilized by the detection circuit for signal demodulation in the identity recognition phase.

Also, in the identity recognition display device according to an embodiment, the fingerprint demodulation carrier wave signal may have the same signal frequency as the control signal provided by the control signal line 200 to the control terminal EM so as to resist against the interference and improve the detection precision.

In an embodiment, during an implementation, there exists a particular fixed phase difference between the fingerprint demodulation carrier wave signal and the control signal. The fixed phase difference may be any value between 0 to 360 degrees. In an embodiment, the fixed phase difference is 0 or 180 degrees. FIG. 8 shows the case where the fixed phase difference is 0.

The signal timing diagram in FIG. 8 is explained by taking the time-sharing driving in the display time period and the identity recognition time period for example. However, in actual operations, the operational timing is not limited to the time-sharing driving manner, for example, the time-sharing driving manner is not employed, or the control terminal EM uses a square wave signal both in the display time period and the identity recognition time period, or the control terminal EM is changed to receive the square wave signal only when the identity recognition function is activated, and normally a light for display is emitted in other circumstances.

During an implementation, in the identity recognition display device provided by an embodiment, since the detection circuit 600 respectively connected with the first recognition output lines 400 and the second recognition output lines 500 needs to differentiate the signals outputted by the first recognition output lines 400 and the second recognition output lines 500 arranged in pairs in the identity recognition time period so as to obtain the denoised identity recognition signal, the detection circuit 600 may specifically comprise a plurality of detection sub-circuits, wherein each detection sub-circuit corresponds in a one-to-one relationship to and is connected with each pair of the first recognition output line 400 and second recognition output line 500.

In an embodiment, each of the detection sub-circuits may comprise: a differential circuit for differentiating electric signals outputted from the first recognition output line and the second recognition output line to obtain a differential signal, thereby denoising an electric signal outputted from the first recognition output line.

When put into practice, the circuit structure of the detection sub-circuit may have many implementations. For instance, FIGS. 9 to 11 respectively show three specific circuit structures. However, the present disclosure is not limited to the three specific circuit structures at all. Those ordinarily skilled in the art can understand that the detection sub-circuit may also adopt other circuit structure, which is not limited in the present disclosure.

Figure 9:
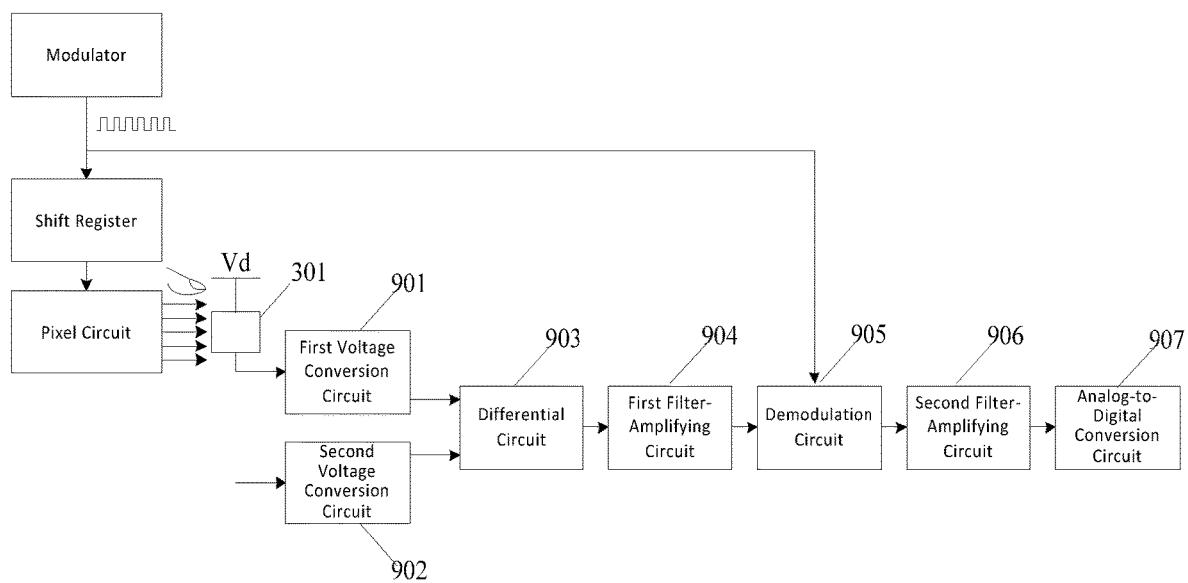
FIG. 9 is a structural schematic view of a detection sub-circuit in the identity recognition display device provided by an embodiment.

FIG. 9 is a structural schematic view of a detection sub-circuit in the identity recognition display device provided by an embodiment. As shown in FIG. 9, the detection sub-circuit may comprise:

a first voltage conversion circuit 901 configured to convert the received current signal outputted from the first recognition output line 400 into a first voltage signal;

a second voltage conversion circuit 902 configured to convert the received current signal outputted from the second recognition output line 500 into a second voltage signal;

a differential circuit 903 respectively connected with the output terminal of the first voltage conversion circuit 901 and the output terminal of the second voltage conversion circuit 902 and configured to differentiate the first voltage signal and the second voltage signal to obtain a differential signal;

a first filter-amplifying circuit 904 connected with an output terminal of the differential circuit 903 and configured to filter-amplify the differential signal;

a demodulation circuit 905 connected with an output terminal of the first filter-amplifying circuit 904 and configured to demodulate the filter-amplified differential signal according to a received fingerprint demodulation carrier wave signal sent by a modulator;

a second filter-amplifying circuit 906 connected with an output terminal of the demodulation circuit 905 and configured to filter-amplify the demodulated differential signal; and an analog-to-digital conversion circuit 907 connected with an output terminal of the second filter-amplifying circuit 906 and configured to convert the filter-amplified demodulated differential signal from an analog signal into a digital signal.

The differential circuit 903 is disposed behind the first voltage conversion circuit 901 and the second voltage conversion circuit 902 so that the current signals outputted from the first recognition output line 400 and the second recognition output line 500 can be trans-impedance amplified before the differentiation. Thus, amplification by an ultralow bias current amplifier at the first level can ensure the signal integrity, and then the signal mixed with a strong noise is denoised so as to make sure that the noise can be effectively removed while keeping the signal integrity.

Figure 10:
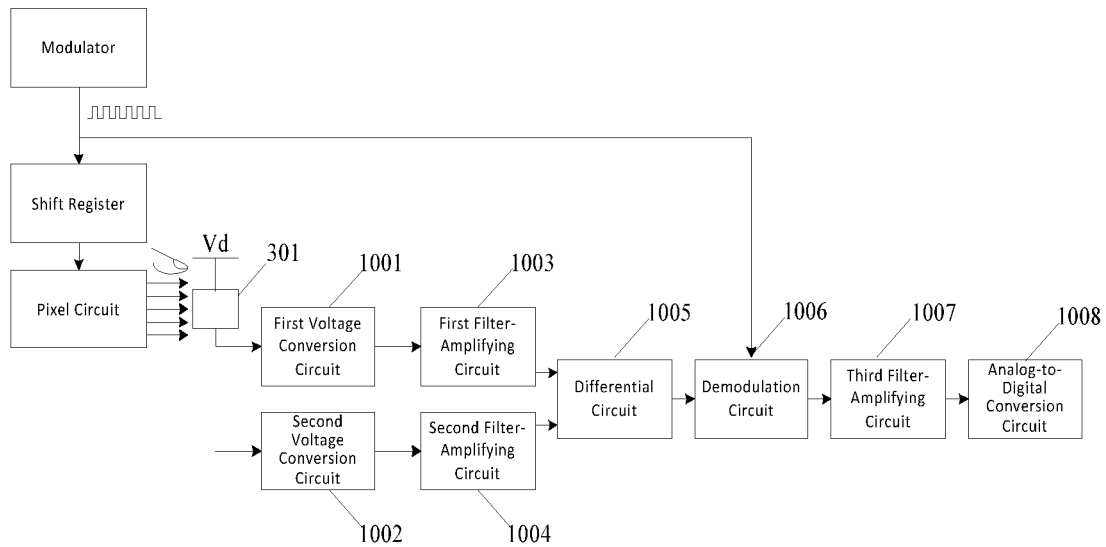
FIG. 10 is a structural schematic view of a detection sub-circuit in the identity recognition display device provided by an embodiment.

FIG. 10 is a structural schematic view of a detection sub-circuit in the identity recognition display device provided by an embodiment. As shown in FIG. 10, the detection sub-circuit may comprise:

a first voltage conversion circuit 1001 configured to convert the received current signal outputted from the first recognition output line 400 into a first voltage signal;

a second voltage conversion circuit 1002 configured to convert the received current signal outputted from the second recognition output line 500 into a second voltage signal;

a first filter-amplifying circuit 1003 connected with an output terminal of the first voltage conversion circuit 1001 and configured to filter-amplify the first voltage signal;

a second filter-amplifying circuit 1004 connected with an output terminal of the second voltage conversion circuit 1002 and configured to filter-amplify the second voltage signal;

a differential circuit 1005 respectively connected with the output terminal of the first filter-amplifying circuit 1003 and the output terminal of the second filter-amplifying circuit 1004 and configured to differentiate the filter-amplified first voltage signal and the filter-amplified second voltage signal to obtain a differential signal;

a demodulation circuit 1006 connected with an output terminal of the differential circuit 1005 and configured to demodulate the differential signal according to a received fingerprint demodulation carrier wave signal sent by a modulator;

a third filter-amplifying circuit 1007 connected with an output terminal of the demodulation circuit 1006 and configured to filter-amplify the demodulated differential signal; and an analog-to-digital conversion circuit 1008 connected with an output terminal of the third filter-amplifying circuit 1007 and configured to convert the filter-amplified demodulated differential signal from an analog signal into a digital signal.

The differential circuit 1005 is disposed behind the first filter-amplifying circuit 1003 and the second filter-amplifying circuit 1004 so that the current signals outputted from the first recognition output line 400 and the second recognition output line 500 can be trans-impedance amplified and filtered before the differentiation. Thus, amplification by an ultralow bias current amplifier at the first level can ensure the signal integrity, and then the signal mixed with a strong noise is denoised so as to make sure that the noise can be effectively removed while keeping the signal integrity.

Figure 11:
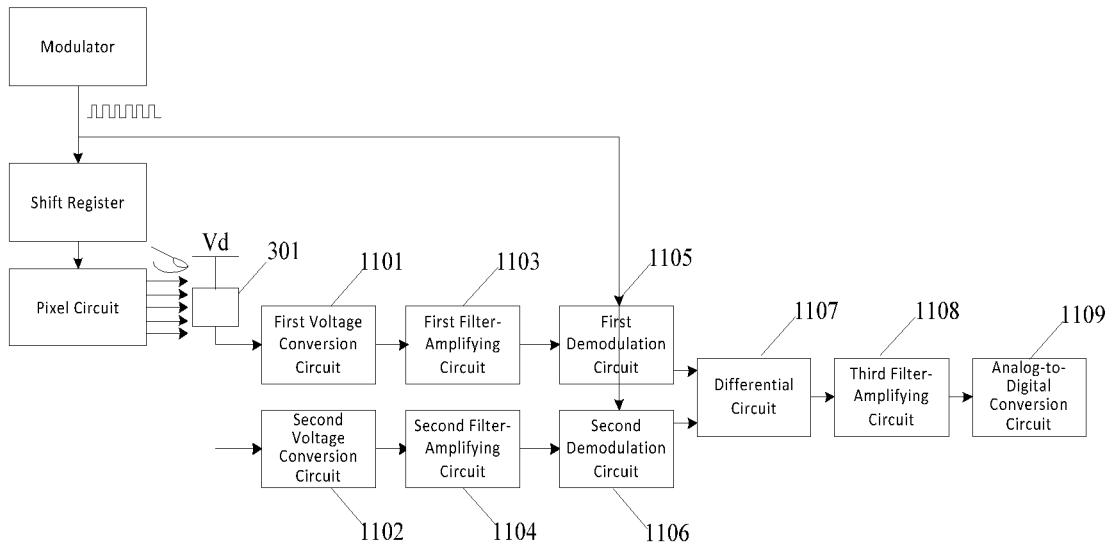
FIG. 11 is a structural schematic view of a detection sub-circuit in the identity recognition display device provided by an embodiment.

FIG. 11 is a structural schematic view of a detection sub-circuit in the identity recognition display device provided by an embodiment. As shown in FIG. 11, the detection sub-circuit may comprise:

a first voltage conversion circuit 1101 configured to convert the received current signal outputted from the first recognition output line 400 into a first voltage signal;

a second voltage conversion circuit 1102 configured to convert the received current signal outputted from the second recognition output line 500 into a second voltage signal;

a first filter-amplifying circuit 1103 connected with an output terminal of the first voltage conversion circuit 1101 and configured to filter-amplify the first voltage signal;

a second filter-amplifying circuit 1104 connected with an output terminal of the second voltage conversion circuit 1102 and configured to filter-amplify the second voltage signal;

a first demodulation circuit 1105 connected with an output terminal of the first filter-amplifying circuit 1103 and configured to demodulate the filter-amplified first voltage signal according to a received fingerprint demodulation carrier wave signal sent by a modulator;

a second demodulation circuit 1106 connected with an output terminal of the second filter-amplifying circuit 1104 and configured to demodulate the filter-amplified second voltage signal according to the received fingerprint demodulation carrier wave signal sent by the modulator;

a differential circuit 1107 respectively connected with the output terminal of the first demodulation circuit 1105 and the output terminal of the second demodulation circuit 1106 and configured to differentiate the demodulated first voltage signal and the demodulated second voltage signal to obtain a differential signal;

a third filter-amplifying circuit 1108 connected with an output terminal of the differential circuit 1107 and configured to filter-amplify the differential signal; and an analog-to-digital conversion circuit 1109 connected with an output terminal of the third filter-amplifying circuit 1108 and configured to convert the filter-amplified differential signal from an analog signal into a digital signal.

The differential circuit 1107 is disposed behind the first demodulation circuit 1105 and the second demodulation circuit 1106 so that the current signals outputted from the first recognition output line 400 and the second recognition output line 500 can be trans-impedance amplified, and filtered and demodulated before the differentiation, so as to remove the noise effectively.

The identity recognition display device provided by the present disclosure may comprise any product or component having a display function, such as a mobile phone, a tablet, a TV, a display, a lap-top computer, a digital frame or a navigator, which is not limited in the present disclosure. The identity recognition display device according to some embodiments of the present disclosure can not only be used for fingerprint detection, but also for recognition of other structures comprising a texture or print feature.

According to some embodiments of the present disclosure, in the identity recognition display device, a plurality of second recognition output lines are added to be arranged in pairs with first recognition output lines, an orthographic projection of the control signal line connected with the pixel circuit on the base substrate overlaps with respective orthographic projections of the first recognition output line and the second recognition output line that are arranged in pair. A parasitic capacitance will unavoidably be produced in the overlapping area, the control signal loaded to the control signal line will be coupled to the first recognition output line and the second recognition output line by the parasitic capacitance to cause similar signal interference to the first recognition output line and the second recognition output line. Meanwhile the first recognition output line and the second recognition output line will also receive similar signal interference from other unknown noises. During the identity recognition time period, after denoising the electric signal outputted from the first recognition output line in the detection circuit, the signal interference in the electric signal outputted by the first recognition output line can be removed by utilizing the noise signal received by the second recognition output line, which is substantially the same as that of the first recognition output line, in such a way to improve the signal-to-noise ratio of the identity recognition signal and guarantee the detection precision of the identity recognition signal.

It can be understood that the above embodiments are only exemplary embodiments of the present invention, but the protection scope of the present invention is not limited thereto. It shall be pointed out that those ordinarily skilled in the art can readily conceive of various variations or replacements without departing from the spirit and principle of the present invention. These variations or replacements will fall within the protection scope of the present invention. The protection scope of the present invention shall be based on the protection scope of the appended claims.

The present application uses such wordings as "first", "second" and "third". Unless specified otherwise in the context, such wordings do not imply any order, but are actually used for the purpose of identification. For instance, the phrases "first recognition output line" and "second recognition output line" do not necessarily mean the first recognition output line is positioned in front of the second recognition output line, or is manufactured or processed earlier than the second recognition output line. In fact, these phrases are only used to identify different recognition output lines.

In the claims, any reference sign in parentheses should not be interpreted as a limitation to the claims. The term "comprise/include" does not exclude the presence of elements or steps other than those listed in the claims. The word "a" or "an" in front of elements does not exclude the presence of a plurality of such elements. In device or system claims that enumerate several means, one or more of the means can be embodied in one and the same item of hardware. The mere fact that some measures are recited in dependent claims that are different from each other does not indicate that the combination of the measures cannot be used to advantage.

What is claimed is:

1. An identity recognition substrate comprising: a plurality of pixel circuits arranged in array on a base substrate, a plurality of control signal lines connected correspondingly with respective rows of the pixel circuits, a plurality of photosensitive elements arranged in array, a plurality of first recognition output lines connected correspondingly with respective columns of the photosensitive elements, a plurality of second recognition output lines arranged in pairs with respective first recognition output lines, and a detection circuit connected with the first recognition output lines and the second recognition output lines respectively; wherein a first recognition output line and a second recognition output line arranged in pair extend in the same direction, and an orthographic projection of a control signal line overlapping the respective orthographic projections of the first recognition output line and the second recognition output line arranged in pair, wherein a control signal loaded to the control signal line causes signal interference to the first recognition output line and the second recognition output line arranged in pair;

the second recognition output line is connected at only one end with the detection circuit and arranged in suspension at the other end;

the detection circuit is configured to denoise an electric signal outputted from the first recognition output line according to a noise signal outputted from the second recognition output line during an identity recognition time period, wherein the noise signal results from the signal interference to the second recognition output line caused by the control signal.

2. The identity recognition substrate according to claim 1, wherein the first recognition output line and the second recognition output line arranged in pair are located in the same gap between the pixel circuits.

3. The identity recognition substrate according to claim 2, wherein the first recognition output line and the second recognition output line arranged in pair are arranged substantially mutually in parallel.

4. The identity recognition substrate according to claim 1, wherein the second recognition output line and the first recognition output line are arranged in the same layer and substantially in parallel, and the second recognition output line and the first recognition output line have an equal line width.

5. The identity recognition substrate according to claim 1, wherein the detection circuit comprises a plurality of detection sub-circuits, each of the detection sub-circuits corresponds in a one-to-one relationship to and is connected with each pair of the first recognition output line and second recognition output line.

6. The identity recognition substrate according to claim 5, wherein each of the detection sub-circuits comprises:

a differential circuit configured to differentiate electric signals outputted from the first recognition output line and the second recognition output line to obtain a differential signal, thereby denoise an electric signal outputted from the first recognition output line.

7. The identity recognition substrate according to claim 6, wherein each of the detection sub-circuits further comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the differential circuit and configured to filter-amplify the differential signal;

a demodulation circuit connected with an output terminal of the first filter-amplifying circuit and configured to demodulate the filter-amplified differential signal according to a received fingerprint demodulation carrier wave signal sent by a modulator;

a second filter-amplifying circuit connected with an output terminal of the demodulation circuit and configured to filter-amplify the demodulated differential signal; and an analog-to-digital conversion circuit connected with an output terminal of the second filter-amplifying circuit and configured to convert the filter-amplified demodulated differential signal from an analog signal into a digital signal, wherein the differential circuit is connected to the output terminal of the first voltage conversion circuit and the output terminal of the second voltage conversion circuit, and configured to differentiate the first voltage signal and the second voltage signal to obtain the differential signal.

8. The identity recognition substrate according to claim 7, wherein the fingerprint demodulation carrier wave signal has the same signal frequency as the control signal.

9. The identity recognition substrate according to claim 8, wherein a particular fixed phase difference exists between the fingerprint demodulation carrier wave signal and the control signal.

10. The identity recognition substrate according to claim 9, wherein the fixed phase difference is 0 or 180 degrees.

11. The identity recognition substrate according to claim 6, wherein each of the detection sub-circuits further comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the first voltage conversion circuit and configured to filter-amplify the first voltage signal;

a second filter-amplifying circuit connected with an output terminal of the second voltage conversion circuit and configured to filter-amplify the second voltage signal;

a demodulation circuit connected with an output terminal of the differential circuit and configured to demodulate the differential signal according to a received fingerprint demodulation carrier wave signal sent by a modulator;

a third filter-amplifying circuit connected with an output terminal of the demodulation circuit and configured to filter-amplify the demodulated differential signal; and an analog-to-digital conversion circuit connected with an output terminal of the third filter-amplifying circuit and configured to convert the filter-amplified demodulated differential signal from an analog signal into a digital signal, wherein the differential circuit is connected to the output terminal of the first filter-amplifying circuit and the output terminal of the second filter-amplifying circuit, and configured to differentiate the filter-amplified first voltage signal and the filter-amplified second voltage signal to obtain the differential signal.

12. The identity recognition substrate according to claim 6, wherein each of the detection sub-circuits further comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the first voltage conversion circuit and configured to filter-amplify the first voltage signal;

a second filter-amplifying circuit connected with an output terminal of the second voltage conversion circuit and configured to filter-amplify the second voltage signal;

a first demodulation circuit connected with an output terminal of the first filter-amplifying circuit and configured to demodulate the filter-amplified first voltage signal according to a received fingerprint demodulation carrier wave signal sent by a modulator;

a second demodulation circuit connected with an output terminal of the second filter-amplifying circuit and configured to demodulate the filter-amplified second voltage signal according to the received fingerprint demodulation carrier wave signal sent by the modulator;

a third filter-amplifying circuit connected with an output terminal of the differential circuit and configured to filter-amplify the differential signal; and an analog-to-digital conversion circuit connected with an output terminal of the third filter-amplifying circuit and configured to convert the filter-amplified differential signal from an analog signal into a digital signal, wherein the differential circuit is connected to the output terminal of the first demodulation circuit and the output terminal of the second demodulation circuit, and configured to differentiate the demodulated first voltage signal and the demodulated second voltage signal to obtain the differential signal.

13. An identity recognition device comprising an identity recognition substrate according to claim 1.

14. The identity recognition device according to claim 13, wherein the detection circuit comprises a plurality of detection sub-circuits, each of the detection sub-circuits corresponds in a one-to-one relationship to and is connected with each pair of the first recognition output line and second recognition output line, wherein each of the detection sub-circuits comprises:

a differential circuit configured to differentiate electric signals outputted from the first recognition output line and the second recognition output line to obtain a differential signal, thereby denoise an electric signal outputted from the first recognition output line.

15. The identity recognition device according to claim 14, wherein each of the detection sub-circuits further comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the differential circuit and configured to filter-amplify the differential signal;

a demodulation circuit connected with an output terminal of the first filter-amplifying circuit and configured to demodulate the filter-amplified differential signal according to a received fingerprint demodulation carrier wave signal sent by a modulator;

a second filter-amplifying circuit connected with an output terminal of the demodulation circuit and configured to filter-amplify the demodulated differential signal; and an analog-to-digital conversion circuit connected with an output terminal of the second filter-amplifying circuit and configured to convert the filter-amplified demodulated differential signal from an analog signal into a digital signal, wherein the differential circuit is connected to the output terminal of the first voltage conversion circuit and the output terminal of the second voltage conversion circuit, and configured to differentiate the first voltage signal and the second voltage signal to obtain the differential signal.

16. The identity recognition device according to claim 14, wherein each of the detection sub-circuits further comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the first voltage conversion circuit and configured to filter-amplify the first voltage signal;

a second filter-amplifying circuit connected with an output terminal of the second voltage conversion circuit and configured to filter-amplify the second voltage signal;

a demodulation circuit connected with an output terminal of the differential circuit and configured to demodulate the differential signal according to a received fingerprint demodulation carrier wave signal sent by a modulator;

a third filter-amplifying circuit connected with an output terminal of the demodulation circuit and configured to filter-amplify the demodulated differential signal; and an analog-to-digital conversion circuit connected with an output terminal of the third filter-amplifying circuit and configured to convert the filter-amplified demodulated differential signal from an analog signal into a digital signal, wherein the differential circuit is connected to the output terminal of the first filter-amplifying circuit and the output terminal of the second filter-amplifying circuit, and configured to differentiate the filter-amplified first voltage signal and the filter-amplified second voltage signal to obtain the differential signal.

17. The identity recognition device according to claim 14, wherein each of the detection sub-circuits further comprises:

a first voltage conversion circuit configured to convert the received current signal outputted from the first recognition output line into a first voltage signal;

a second voltage conversion circuit configured to convert the received current signal outputted from the second recognition output line into a second voltage signal;

a first filter-amplifying circuit connected with an output terminal of the first voltage conversion circuit and configured to filter-amplify the first voltage signal;

a second filter-amplifying circuit connected with an output terminal of the second voltage conversion circuit and configured to filter-amplify the second voltage signal;

a first demodulation circuit connected with an output terminal of the first filter-amplifying circuit and configured to demodulate the filter-amplified first voltage signal according to a received fingerprint demodulation carrier wave signal sent by a modulator;

a second demodulation circuit connected with an output terminal of the second filter-amplifying circuit and configured to demodulate the filter-amplified second voltage signal according to the received fingerprint demodulation carrier wave signal sent by the modulator;

a third filter-amplifying circuit connected with an output terminal of the differential circuit and configured to filter-amplify the differential signal; and an analog-to-digital conversion circuit connected with an output terminal of the third filter-amplifying circuit and configured to convert the filter-amplified differential signal from an analog signal into a digital signal, wherein the differential circuit is connected to the output terminal of the first demodulation circuit and the output terminal of the second demodulation circuit, and configured to differentiate the demodulated first voltage signal and the demodulated second voltage signal to obtain the differential signal.

18. An identity recognition circuit in an identity recognition device, the identity recognition device comprising a plurality of pixel circuits arranged in array on a base substrate, a plurality of control signal lines connected correspondingly with respective rows of the pixel circuits, the identity recognition circuit comprising: a photosensitive element, a first recognition output line connected correspondingly with the photosensitive element, a second recognition output line arranged in pair with the first recognition output line, and a detection sub-circuit connected with the first recognition output line and the second recognition output line respectively, wherein the first recognition output line and the second recognition output line arranged in pair extend in the same direction, and an orthographic projection of a control signal line overlapping the respective orthographic projections of the first recognition output line and the second recognition output line arranged in pair, wherein a control signal loaded to the control signal line causes signal interference to the first recognition output line and the second recognition output line arranged in pair;

the second recognition output line is connected at only one end with the detection sub-circuit and arranged in suspension at the other end; and the detection sub-circuit is configured to denoise an electric signal outputted from the first recognition output line according to a noise signal outputted from the second recognition output line during an identity recognition time period, wherein the noise signal results from the signal interference to the second recognition output line caused by the control signal.

19. The identity recognition circuit according to claim 18, wherein the detection sub-circuit comprises:

a differential circuit configured to differentiate electric signals outputted from the first recognition output line and the second recognition output line to obtain a differential signal, thereby denoise an electric signal outputted from the first recognition output line;

a demodulation circuit configured to demodulate the differential signal according to a received fingerprint demodulation carrier wave signal sent by a modulator;

a filter-amplifying circuit configured to filter-amplify the demodulated differential signal; and an analog-to-digital conversion circuit configured to convert the filter-amplified demodulated differential signal from an analog signal into a digital signal.

20. The identity recognition circuit according to claim 18, wherein the detection sub-circuit comprises:
- a demodulation circuit configured to demodulate electric signals outputted from the first recognition output line and the second recognition output line according to a received fingerprint demodulation carrier wave signal sent by a modulator;
- a differential circuit configured to differentiate the demodulated signals to obtain a differential signal;
- a filter-amplifying circuit configured to filter-amplify the differential signal; and
- an analog-to-digital conversion circuit configured to convert the filter-amplified differential signal from an analog signal into a digital signal.

* * * * *